United States Patent
Chaussat et al.

(10) Patent No.: US 11,553,594 B2
(45) Date of Patent: Jan. 10, 2023

(54) WIRELESS MACHINE CONDITION MONITORING DEVICE

(71) Applicant: AKTIEBOLAGET SKF, Gothenburg (SE)

(72) Inventors: Sylvain Chaussat, Mont-Pres-Chambord (FR); Jens Graf, Schweinfurt (DE); Arnaud Pinon, Azay sur Cher (FR)

(73) Assignee: AKTIEBOLAGET SKF, Gothenburg (SE)

( * ) Notice: Subject to any disclaimer, the term of this patent is extended or adjusted under 35 U.S.C. 154(b) by 372 days.

(21) Appl. No.: 16/997,283

(22) Filed: Aug. 19, 2020

(65) Prior Publication Data
US 2021/0092848 A1    Mar. 25, 2021

(30) Foreign Application Priority Data
Sep. 23, 2019   (DE) .......................... 102019214416.0

(51) Int. Cl.
*H05K 1/18* (2006.01)
*G01H 1/00* (2006.01)

(52) U.S. Cl.
CPC ............... *H05K 1/181* (2013.01); *G01H 1/00* (2013.01); *H05K 2201/10151* (2013.01)

(58) Field of Classification Search
CPC ...................................................... H05K 1/181

USPC .......................................................... 361/748
See application file for complete search history.

(56) References Cited

U.S. PATENT DOCUMENTS

| | | | |
|---|---|---|---|
| 6,265,979 B1 * | 7/2001 | Chen ...................... | G01V 1/008 73/649 |
| 2010/0042328 A1 * | 2/2010 | Diaz-Lopez ........... | G01V 1/008 702/15 |
| 2015/0029682 A1 * | 1/2015 | Kadoya ................ | H05K 9/0064 361/748 |
| 2021/0048934 A1 * | 2/2021 | Van Ostrand ......... | G06F 3/0441 |
| 2021/0296408 A1 * | 9/2021 | Hong ................... | A61B 5/0053 |
| 2022/0099708 A1 * | 3/2022 | Labbe ..................... | G01R 1/04 |

\* cited by examiner

*Primary Examiner* — Stanley Tso
(74) *Attorney, Agent, or Firm* — J-TEK Law PLLC; Scott T. Wakeman; Mark A. Ussai (57) ABSTRACT

A condition monitoring device configured to be mounted on a machine for sensing, for example, vibrations produced by the machine during operation, includes a base, a printed circuit board assembly lying in a first plane, and first and second fasteners, each having a longitudinal axis, lying in a second plane perpendicular to the first plane, the first and second fasteners extending through the printed circuit board assembly and into the base. A third plane is perpendicular to the first and second planes and is located halfway between the longitudinal axes of the first and second fasteners. An integrated power supply is connected to the printed circuit board assembly, and at least two active sensing cells, such as vibration sensors, are arranged symmetrically relative to the second plane and/or symmetrically relative to the third plane.

15 Claims, 5 Drawing Sheets

WIRELESS MACHINE CONDITION MONITORING DEVICE

CROSS-REFERENCE

This application claims priority to German patent application no. 10 2019 214 416.0 filed on Sep. 23, 2019, the contents of which are fully incorporated herein by reference.

TECHNOLOGICAL FIELD

The present disclosure relates to the field of condition monitoring devices, and in particular to condition monitoring sensors for monitoring the condition of a system such as a rotating machine.

BACKGROUND

Condition monitoring devices allow the condition of a system to be monitored without the need of manual inspection. These devices may be particularly advantageous in remote locations or locations which are difficult and/or dangerous to access, such as axles and/or bearings of a wide system of rotating machine.

The analysis of vibration signals produced by rotating machines is well known in the field of machine condition monitoring.

Generally, electrical sensors are used to gather vibration measurements that may then be analyzed to determine the machine condition and detect any machine defects.

In many situations, it may be convenient for the condition monitoring devices to be powered by an integrated generation source. Indeed, it may be necessary to provide electric energy to devices that are located in remote locations, for example where either power supply infrastructure does not exist or, if an infrastructure does exist, power is not available at the specific location where the device is installed.

To power condition monitoring devices, it is known to use a battery pack or limited capability power source such as an energy harvester.

Such condition monitoring device relies on vibrations produced by the machine being monitored.

Known condition monitoring devices generally comprise a single vibration sensor connected to a printed board circuit, an amplification circuit to increase the vibration signal and a wireless transmitter to send vibration information to a display device or deep analysis center.

An overly amplified signal will also amplify the noise in the signal.

SUMMARY

There is thus a need to provide a condition monitoring device for measuring vibrations of a rotating machine that is capable of transmitting a better quality vibration signal, while reducing disturbance, such as noise, distortion, etc.

It is therefore an aspect of the present disclosure to provide a condition monitoring device configured to be mounted on a rotating machine, for example on a housing of an electric motor, in the vicinity of a rolling bearing, comprising:
 a base, for example, made in metallic material,
 a printed circuit board assembly (PCBA) extending along a first axis and fixed on said base by two fastening elements, said fastening elements being arranged on a second axis and extending along a third axis perpendicular to the first and second axes; said fastening elements being symmetrical compared to a first symmetrical axis parallel to the first axis;
 an integrated power supply, such as for example a battery connected to the PCBA; and
 a sensing element mounted between the two fixation elements and comprising at least two active sensing cells arranged symmetrically compared to the first axis passing through a symmetrical axis of the fixation element.

For example, the first axis may be a vertical axis, the second axis may be a longitudinal axis and the third axis may be a transversal axis.

In another embodiment, the first axis may be a transversal axis, the second axis may be a longitudinal axis and the third axis may be a vertical axis.

In any way, the fastening elements can extend along an axis perpendicular to the axis of extension of the PCBA.

The fastening elements extend can along an axis perpendicular to the mounting surface of the base.

The condition monitoring device is configured to acquire vibration signals produced by the rotating machine and to wirelessly transmit said vibration signals to a data analyzer, for example via a gateway, in order to analyze the signals received and to determine the condition of the rotating machine.

The base allows a mechanical fixation of the PCBA and vibration transfer of the rotating machine to said PCBA.

Advantageously, the printed circuit board assembly has a lower part extending along the first axis, for example vertically, downwards beyond the battery, for example its lower end, on which the sensing element is mounted, said lower part being fixed on the base. In such way, the sensing element is located near the base.

The two active sensing cells are fixed on the front surface of the lower part of the PCBA in order to be at the vicinity of the fixation between the PCBA and the base.

The base may comprise a first fixation portion designed to be fixed to the rotating machine and a second fixation portion extending upwards along the first axis from the first fixation portion and having a substantially flat mounting surface in contact with the lower part of the printed circuit board assembly, for example its rear surface.

The first fixation portion is, for example, substantially cylindrical.

Said second fixation portion may have a semi conical shape.

Alternatively, the second fixation portion may be semi cylindrical with a flat mounting surface.

The PCBA thus bears against said flat surface and is fixed by two fixation elements, such as screws screwed fastened along the third axis. The fixation elements are located symmetrically compared to the first axis.

The flatness of the fixation surface is particularly important, since the more the fixation surface is flat, the better the vibration signal will be transmitted from the base to the PCBA. However, the flatness of the fixation surface is not essential to the invention.

According to an embodiment, the two active sensing cells are arranged along the first axis, notably along the symmetrical axis of the fixation elements.

According to another embodiment, the two active cells of the sensing element are arranged along a second axis passing through the fixation elements.

According to an embodiment, the sensing element comprises at least three active cells arranged along the first axis passing through the symmetrical axis of the fixation elements and are symmetrical compared to the second axis. The second axis thus passes through one of the active cells.

According to another embodiment, the sensing element comprises at least four active cells arranged along the first axis and are symmetrical compared to the second axis.

According to another embodiment, the sensing element comprises at least four active cells arranged two by two along the first axis, a pair of active cells being symmetric with another pair of active cells compared to the first axis passing through the symmetrical axis of the fixation elements.

Each active sensing cells may be mounted on an electronic component or all active sensing cells may be mounted on a single electronic component.

The active sensing cells may be for example piezoelectric elements or an accelerometer.

The fixation surface is slightly offset compared to the plane comprising the first axis and the second axis. However, in another embodiment, the fixation surface may be located in the plane comprising the first axis and the second axis.

The battery is, for example, welded on the rear surface of the PCBA. However, the battery may be fixed on the PCBA by any other way.

The condition monitoring device may comprise a housing covering and protecting the PCBA and the battery. The housing may be made from a material having high electromagnetic permeability, such as for example plastic, rubber or a resin or thermo-plastic.

The condition monitoring device may comprise an antenna for wireless communication located in the upper part of the PCBA.

The printed circuit board assembly may comprise a first elongated printed circuit board having a plate shape extending along a vertical axis and a second elongated printed circuit board having a plate shape extending along the vertical axis.

The second PCB may be mounted on a front surface of the first PCB, opposite to the battery. In other words, the printed circuit boards are superposed along the transversal axis.

For example, the second PCB has particular holes, for example a round through-hole used to avoid bubbles effect and add attaching points between the lateral faces of the PCB during a process of injecting a potting compound, such as for example a resin.

For example, the second PCB has also two oblong through-holes extending along the first axis and used to avoid any interference between high components on the first PCB and the second PCB. Said oblong through-holes also allows to contain enough potting compound. This particular oblong shape gives also some tolerance margin and act as attaching points between the lateral faces of the PCB during a process of injecting the potting compound.

The dimensions of the second PCB may be smaller than the dimensions of the first PCB.

Alternatively, the printed circuit board assembly may comprise a single printed circuit board or more than two printed circuits boards.

According to an embodiment, a printed circuit board of the PCBA lies in a first plane (X-Z) and is connected to a base by first and second fixation elements such as rivets or by threaded fasteners such as screws. The longitudinal axes of the fixation elements lie in a second plane (X-Y) perpendicular to first plane. A third plane (Y-Z) is perpendicular to both the first plane and to the second plane and is located halfway between the axes of the first and second fixation elements. At least two sensing cells, piezoelectric elements, for example, are mounted on the first printed circuit board. When the at least two sensing cells comprise a first sensing cell and a second sensing cell, the first sensing cell is mounted above the second plane and the second sensing cell is located symmetrically below the second plane, and the first and second sensing cells may be bisected by the third plane. When the at least two sensing cells include a third sensing cell, the third sensing cell is mounted between the first and second sensing cells such that it is bisected by the second plane and the third plane. When the at least two sensing cells include a fourth sensing cell, all four sensing cells may be arranged along the third plane, two above and two below the second plane or the first and second sensing cells may be mounted above the second plane, one on each side of the third plane and the third and fourth sensing cells may mounted below the second plane, one on each side of the third plane.

According to another aspect, the invention relates to a method for processing vibration signal received from the condition monitoring device as described above.

The Method Comprises:

associating the vibration signals in time domain provided respectively from the active cells of the sensing element in order to obtain a resulting signal in frequency domain having a better amplitude and reducing the noise.

Indeed, thanks to the specific arrangement of the active cells between the fixation elements and being symmetrical compared to the first axis passing through the symmetrical axis of said fixation elements, spatial synchronized vibration signals are added.

The Method Further Comprises:

amplifying the resulting signal; and transmitting said amplified resulting signal to a data processor.

BRIEF DESCRIPTION OF THE DRAWINGS

The present invention and its advantages will be better understood by studying the detailed description of specific embodiments given by way of non-limiting examples and illustrated by the appended drawings on which.

DETAILED DESCRIPTION

In the following description, the terms "longitudinal, "transversal", "vertical", "front", "rear", "left" and "right"

are defined according to a usual orthogonal benchmark as shown on the drawings, which includes:

a longitudinal axis X, horizontal and left to the right of front views;

a transversal axis Y, perpendicular to the longitudinal axis X and extending from the rear to the front of front views; and a vertical axis Z, orthogonal to the longitudinal and transversal axis X and Y.

FIGS. 1 to 4 illustrate an embodiment of a wireless machine condition monitoring device 10 according to the disclosure that is designed to be mounted on a rotating machine (not shown), for example on a housing of an electric motor, in the vicinity of a rolling bearing.

The condition monitoring device 10 is configured to acquire raw vibration signals produced by the rotating machine, to amplify the signals, to process the signals with its data processor and to wirelessly transmit said vibration signals to a data center, for example via a gateway, in order to analyze the signals received and to determine the condition of the rotating machine.

The condition monitoring device 10 comprises a base 12, for example made of metallic material, a printed circuit board assembly 14 (sometimes abbreviated "PCBA") mounted on said base 12, an integrated power supply 16, such as for example a battery connected to the PCBA 14, a potting compound 17 surrounding the PCBA 14 and the battery 16 and a housing 18 covering and protecting the potting compound 17, the PCBA 14 and the battery 16.

The housing 18 may be made from a material having high electromagnetic permeability, such as for example plastic, rubber or a resin.

The potting compound 17 is, for example, made of a resin injected through through-holes 18a made on the housing 18 inside the inner volume 18b delimited in said housing 18. The potting compound 17 is injected until a level of potting 18a below the inner surface of the upper part of the housing, as shown for example on FIGS. 4 and 5. The level of potting 17a extend axially beyond the upper border of the PCBA 14.

As illustrated, an antenna 19 is located in the upper part of the PCBA 14.

The battery 16 is, for example, welded on the rear surface of the PCBA 14. However, the battery 16 may be fixed on the PCBA 14 by any other way.

As illustrated, the printed circuit board assembly 14 comprises a first elongated printed circuit board 14a having a plate shape extending along a first axis Z, here vertical, and a second elongated printed circuit board 14b having a plate shape extending along the first axis Z. The second PCB 14b is mounted on a front surface of the first PCB 14a, opposite to the battery 16. In other words, the printed circuit boards are superposed along the transversal axis Y. The dimensions of the second PCB 14b are smaller than the dimensions of the first PCB 14a.

Alternatively, the printed circuit board assembly 14 may comprise a single printed circuit board or more than two printed circuits boards.

Figure 1:
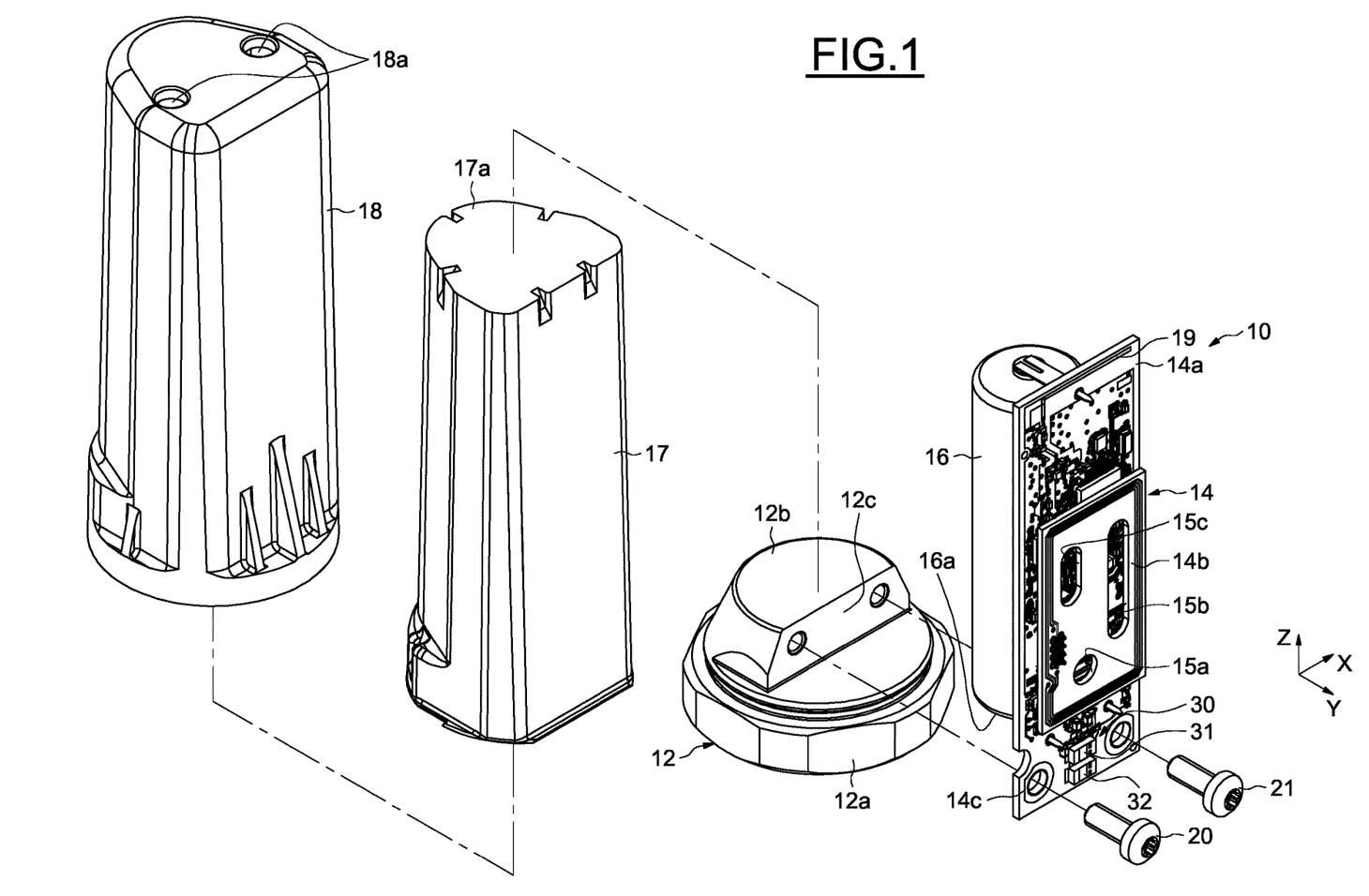
FIG. 1 is an exploded perspective view of a condition monitoring device according to an embodiment of the invention.

As illustrated for example in FIG. 1, the second PCB 14b has a particular configuration of holes 15a, 15b, 15c, which may include a round through-hole 15a used to avoid bubbles effect and add attaching points between the lateral faces of the PCB during a process of injecting a potting compound, such as for example a resin.

The second PCB 14b further comprises two oblong through-holes 15b, 15c extending along the first axis Z and used to avoid any interference between tall components projecting from the first PCB 14a and the second PCB 14b. Said oblong through-holes also allows to contain enough potting compound. This particular oblong shape also gives some tolerance margin and act as attaching points between the lateral faces of the PCB during a process of injecting the potting compound.

Figure 3:
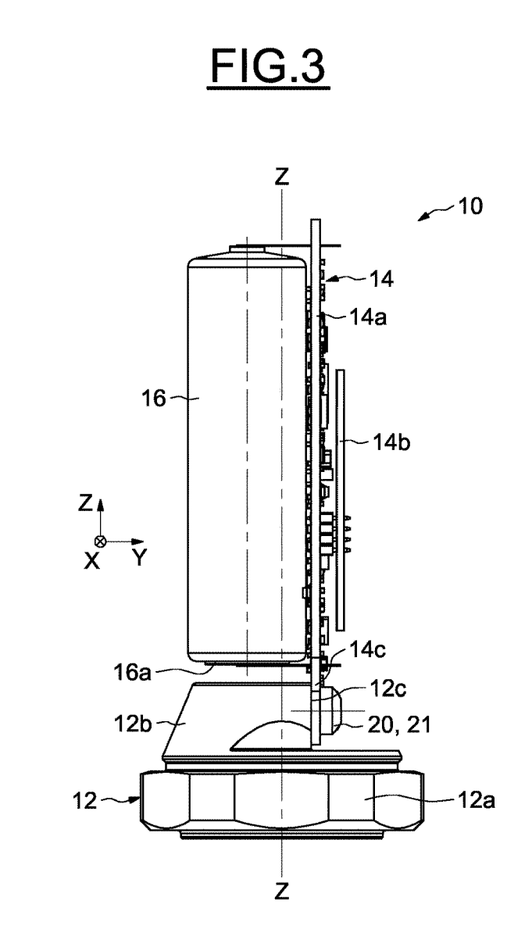
FIG. 3 is a cross-section of a monitoring device of FIG. 1.

As can be seen on FIGS. 1 and 3, the printed circuit board assembly 14 has a vertical length greater than the length of the battery 16 so that the lower part 14c of said PCBA 14 extends vertically beyond the lower end 16a of the battery 16.

The lower part 14c of the PCBA 14 is used to fix the PCBA 14 on the base 12.

Therefore, the base 12 comprises a first fixation portion 12a designed to be fixed to the rotating machine. The first fixation portion 12a is substantially cylindrical. The base 12 further comprises a second fixation portion 12b extending along the first axis, here the vertical axis Z from the upper surface of the first fixation portion 12a.

Said second fixation portion 12b has a partly frustoconical shape delimited by a plane mounting surface 12c configured to contact the rear surface of the lower part 14c of the PCBA 14. Alternatively, the second fixation portion 12b may be semi cylindrical (comprise a portion of a cylinder) with a plane mounting surface 12c.

The PCBA 14 thus bears against said plane surface 12c and is fixed by two fixation elements 20, 21 spaced apart along a second axis, here the longitudinal axis X. The fixation elements 20, 21 extend along a third axis, here the transversal axis Y. For example, the fixation elements 20, 21 are screws configured to be fastened along a third axis, here the transversal axis Y. The fixation elements 20, 21 are located symmetrically relative to the vertical axis Z.

The flatness of the fixation surface 12c is particularly important, since the flatter the fixation surface 12c, the better the vibration signal will be transmitted from the base to the PCBA 14. However, while important, the flatness of the fixation surface 12c is not essential to the invention.

Figure 4:
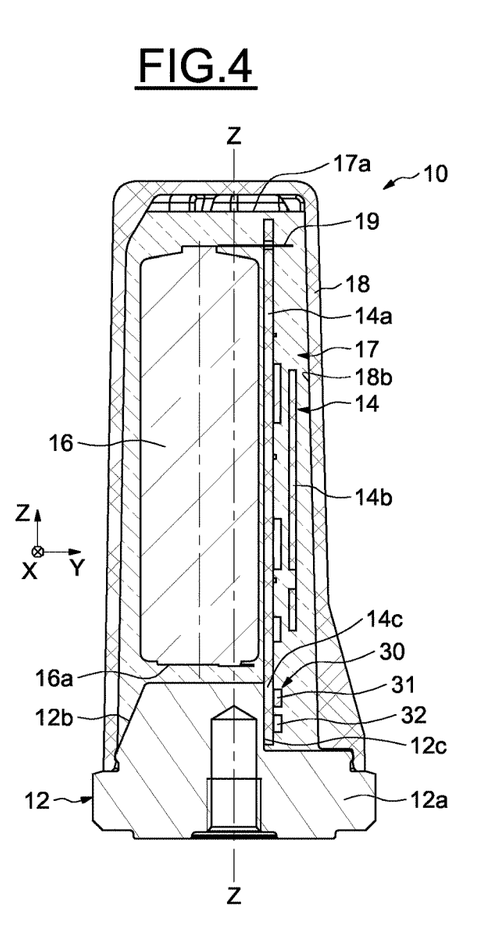
FIG. 4 is a cross-section of a monitoring device according to a second embodiment.
Figure 5:
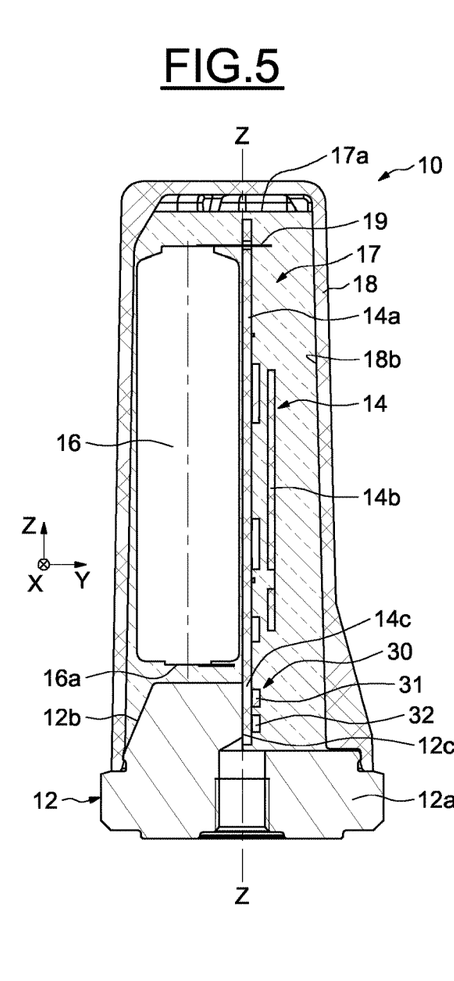
FIG. 5 is a front view of a monitoring device according to a third embodiment.

As can be seen on FIGS. 3 and 4, the fixation surface 12c is slightly offset compared to a central plane XZ comprising the vertical axis Z and the longitudinal axis X. However, in another embodiment shown on FIG. 5, the fixation surface 12c may be located in the plane XZ (on the central plane) comprising the vertical axis Z (first axis) and the longitudinal axis X (second axis).

The base 12 thus allows a mechanical fixation of the PCBA 14 and allows vibration transfer of the moving machine to said PCBA 14.

The condition monitoring device 10 further comprises a sensing element 30 configured to sense vibrations from the moving machine transmitted to the fixation surface 12c of the base 12.

The sensing element 30 is mounted between the two fixation elements 20, 21. The two fixation elements 20, 21 are symmetrical compared to a symmetrical axis Z-Z passing through the center of the PCBA 14.

As illustrated on FIGS. 1 to 4, the sensing element 30 comprises two active sensing cells 31, 32.

Figure 2A:
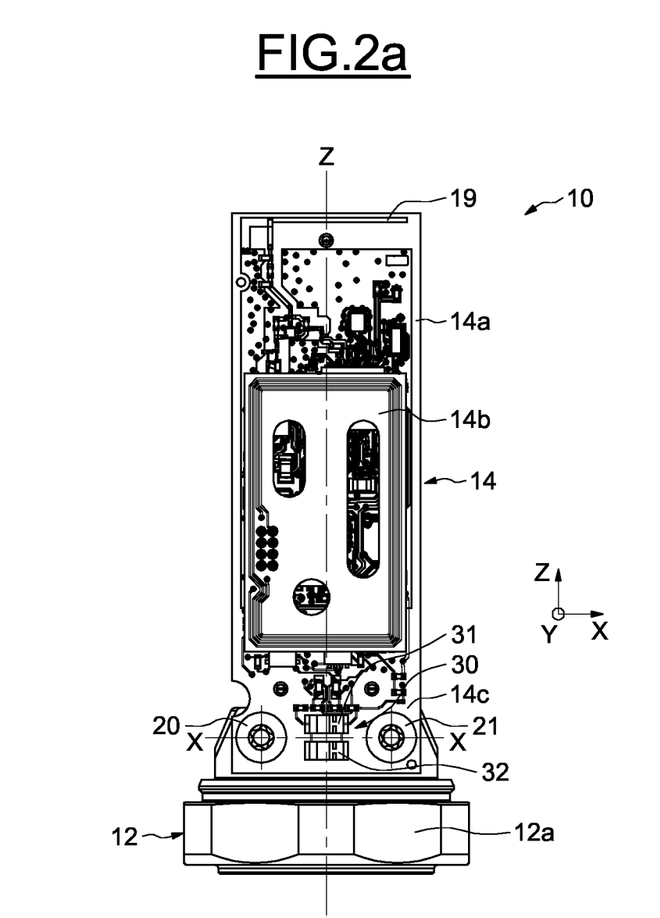
FIG. 2a is a front view of the monitoring device of FIG. 1.
Figure 2B:
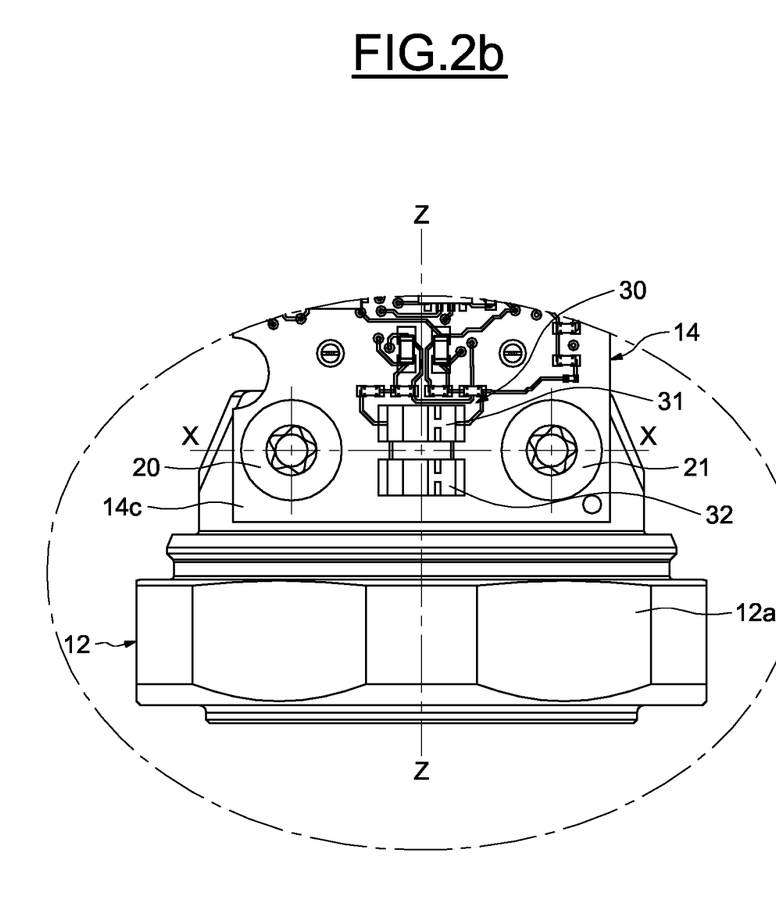
FIG. 2b is a front view of the monitoring device of FIG. 1, with two active cells in a single sensor unit.

Each of the active sensing cells 31, 32 may be mounted on an electronic component as shown on FIG. 2a or both active sensing cells 30, 31 may be mounted on a single electronic component as shown on FIG. 2b.

The active sensing cells 31, 32 may be for example piezoelectric elements or an accelerometer.

The two active sensing cells 31, 32 are fixed on the front surface of the lower part 14c of the PCBA 14, in order to be near the junction of the PCBA 14 and the base 12.

According to the first embodiment shown in FIGS. 1 to 5, the two active sensing cells 31, 32 are arranged along the vertical axis Z passing through the symmetrical axis Z-Z of the fixation elements 20, 21 and are symmetrical relative to the longitudinal axis X.

Figure 6:
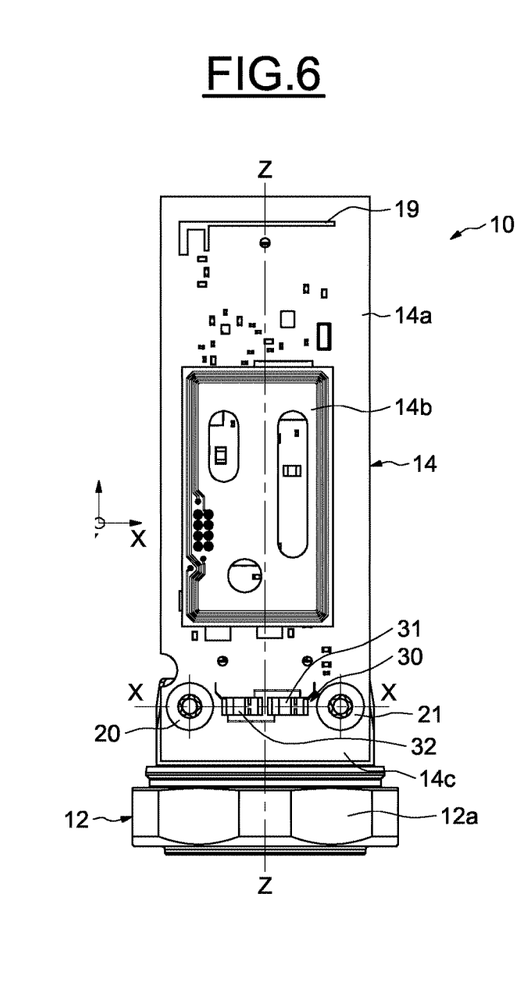
FIG. 6 is a front view of a monitoring device according to a fourth embodiment.

The embodiment shown in FIG. 6, in which identical parts are given identical references, differs from the previous embodiment in that the two active cells 31, 32 of the sensing element 30 are arranged along the longitudinal axis X passing through the fixation elements 20, 21 and are symmetrical relative to the vertical axis Z passing through the symmetrical axis Z-Z of the fixation elements 20, 21.

Figure 7:
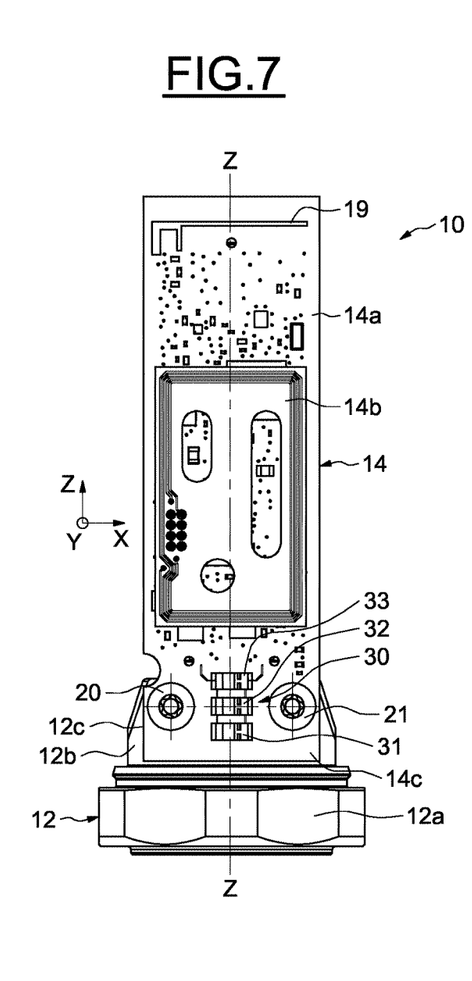
FIG. 7 is a front view of the monitoring device according to a fifth embodiment.

The embodiment shown in FIG. 7, in which identical parts are given identical references, differs from the previous embodiment in that the sensing element 30 comprises three active cells 31, 32, 33 arranged along the vertical axis Z passing through the symmetrical axis Z-Z of the fixation elements 20, 21 and are symmetrical compared to the longitudinal axis X. The longitudinal axis X thus passes through one of the active cells 32.

Figure 8:
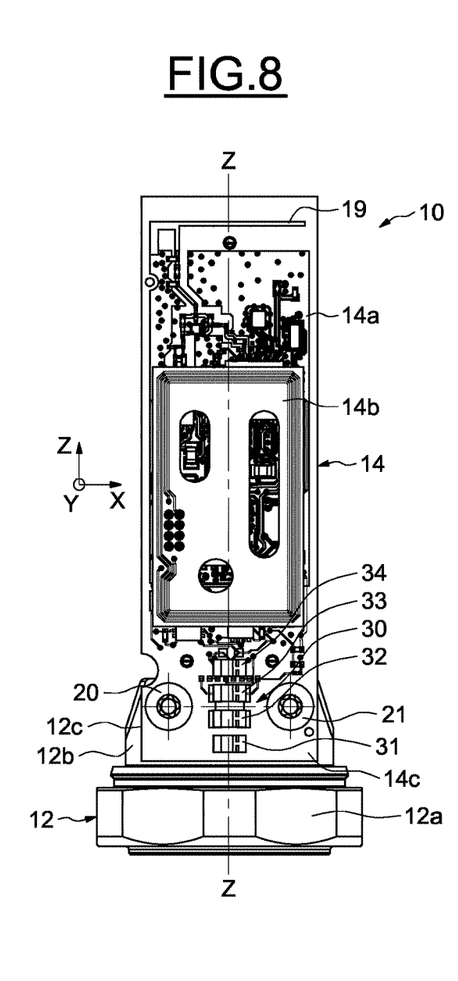
FIG. 8 is a front view of the monitoring device according to a sixth embodiment.

The embodiment shown on FIG. 8, in which identical parts are given identical references, differs from the embodiment of FIGS. 1 to 4 in that the sensing element 30 comprises four active cells 31, 32, 33, 34 arranged along the vertical axis and are symmetrical compared to the longitudinal axis X.

Figures 9, 10, 11:
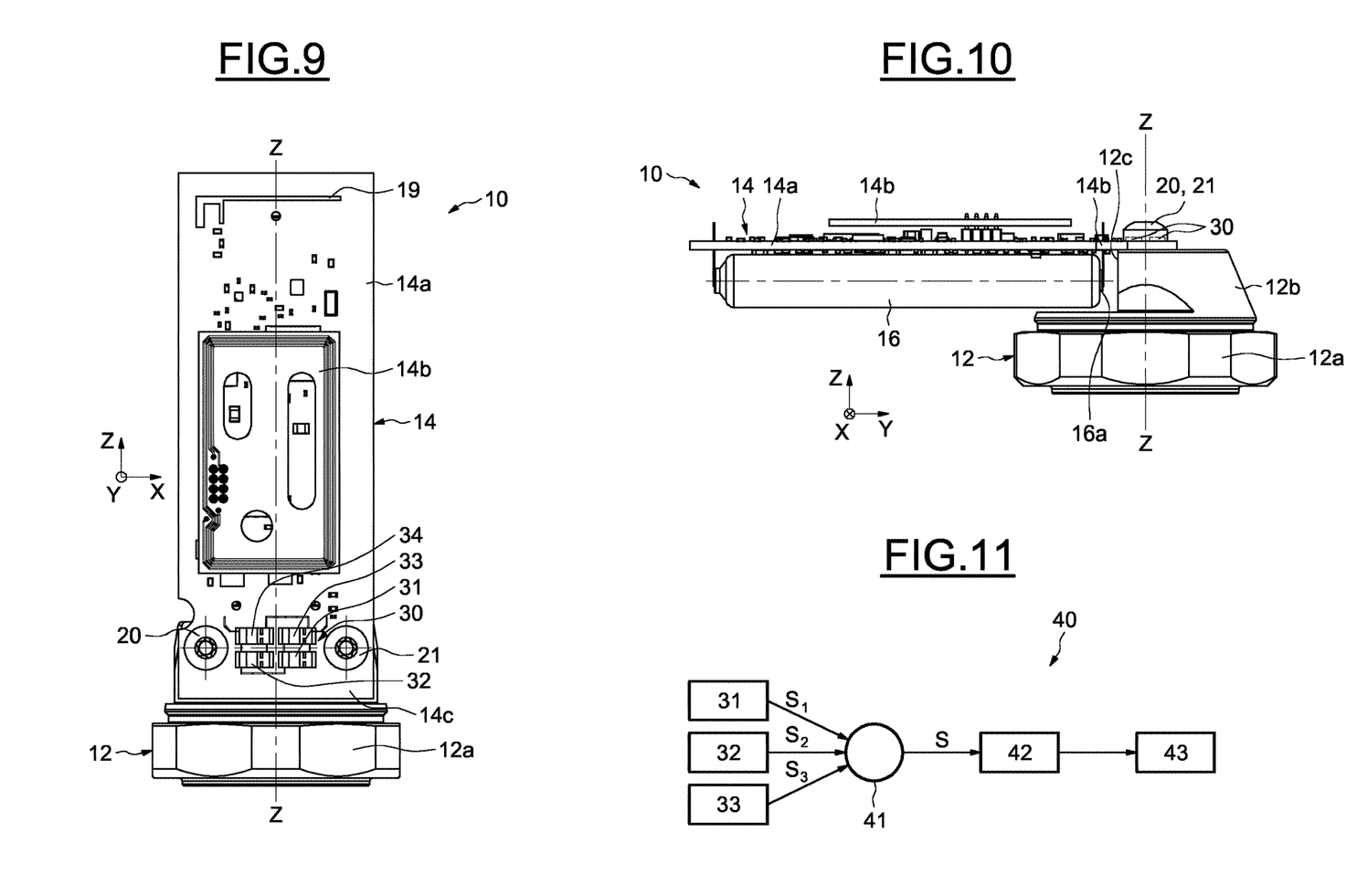
FIG. 9 is a front view of the monitoring device according to a seventh embodiment.
FIG. 10 is a front view of the monitoring device according to a eight embodiment.
FIG. 11 is a schematic chart showing a signal processing method applied to the condition monitoring device according to FIG. 7.

The embodiment shown on FIG. 9, in which identical parts are given identical references, differs from the previous embodiment in that the four active cells 31, 32, 33, 34 of the sensing element 30 are arranged two by two along the vertical axis Z. A pair of active cells 31, 33 is symmetric with another pair of active cells 32, 34 compared to the vertical axis Z passing through the symmetrical axis Z-Z of the fixation elements 20, 21.

The embodiment shown on FIG. 10, in which identical parts are given identical references, differs from the embodiment of FIG. 3 in that the printed circuit board assembly extend along a transversal axis Y (first axis) and fixed on said base, notably on a mounting surface 12d by two fastening elements 20, said fastening elements being spaced apart along a longitudinal axis X (second axis) and extending along a vertical axis (third axis) perpendicular to the transversal and longitudinal axes Y, X.

In a general way, the printed circuit board assembly extending along a first axis, called "PCBA" and fixed on said base by two fastening elements, said fastening elements being arranged on a second axis and extending along a third axis perpendicular to the first and second axes.

The first axis may be a vertical axis, the second axis may be a longitudinal axis and the third axis may be a transversal axis, as shown on FIGS. 1 to 9. Alternatively, the first axis may be a transversal axis, the second axis may be a longitudinal axis and the third axis may be a vertical axis, as shown on FIG. 10.

In any way, the fastening elements extend along an axis perpendicular to the axis of extension of the PCBA.

The fastening elements extend along an axis perpendicular to the mounting surface of the base.

As can be seen in FIG. 11, a signal processing method 40 is applied to the condition monitoring device 10 according to the embodiment of FIG. 7, in which the sensing element 30 comprises three active cells 31, 32, 33. However, said signal processing method 40 may be applied to condition monitoring device according to any preceding embodiments.

The vibration signals in the time domain S1, S2, S3 provided respectively from the active cells 31, 32, 33 are associated at step 41 in order to obtain a resulting signal S in the frequency domain having a better amplitude corresponding to the addition of the amplitudes of each signal S1, S2, S3, without the noise. Indeed, thanks to the specific arrangement of the active cells between the fixation elements and being symmetrical relative to the vertical axis passing through the symmetrical axis Z-Z of said fixation elements, only spatial synchronized vibration signals are added.

At step 42, said resulting signal S is amplified and transmitted at step 43 to a data processor (not shown).

The arrangement of the active cells thus allows an accurate vibration measurement to be obtained without distortions.

Thanks to the disclosure, the vibration signals are amplified without increasing noise and distortion of the signal. It is thus possible to obtain more accurate information on the vibration of the moving machine.

Representative, non-limiting examples of the present invention were described above in detail with reference to the attached drawings. This detailed description is merely intended to teach a person of skill in the art further details for practicing preferred aspects of the present teachings and is not intended to limit the scope of the invention. Furthermore, each of the additional features and teachings disclosed above may be utilized separately or in conjunction with other features and teachings to provide improved wireless machine condition monitoring devices.

Moreover, combinations of features and steps disclosed in the above detailed description may not be necessary to practice the invention in the broadest sense, and are instead taught merely to particularly describe representative examples of the invention. Furthermore, various features of the above-described representative examples, as well as the various independent and dependent claims below, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

What is claimed is:

1. A condition monitoring device configured to be mounted on a machine, the condition monitoring device comprising:
   a base,
   a printed circuit board assembly including at least one printed circuit board lying in a first plane,
   a first fastener and a second fastener each having a longitudinal axis lying in a second plane perpendicular to the first plane, the first and second fasteners extending through the printed circuit board assembly and into the base, a third plane perpendicular to the first plane and perpendicular to the second plane being located halfway between the longitudinal axes of the first and second fasteners,
   an integrated power supply connected to the printed circuit board assembly; and
   a sensor mounted to the at least one printed circuit board, the sensor comprising at least two active sensing cells arranged symmetrically relative to the second plane.

2. The condition monitoring device according to claim 1, wherein the at least two active sensing cells are intersected by the third plane.

3. The condition monitoring device according to claim 1, wherein the at least two active sensing cells are bisected by the third plane.

4. The condition monitoring device according to claim 1, wherein the at least two active sensing cells are arranged symmetric relative to the third plane.

5. The condition monitoring device according to claim 1, wherein a lower part of the printed circuit board assembly extends downward beyond the battery, and wherein the first fastener and the second fastener extend through the lower part of the printed circuit board assembly.

6. The condition monitoring device according to claim 5, wherein the base comprises:
   a first fixation portion configured to be fixed to the machine, and
   a second fixation portion comprising a wall parallel to the first plane,
   wherein the lower part of the printed circuit board assembly is held against the second fixation portion by the first and second fasteners.

7. The condition monitoring device according to claim 1, wherein the at least two active sensing cells comprise at least three active sensing cells bisected by the third plane and arranged symmetric relative to the second plane.

8. The condition monitoring device according to claim 1, wherein the at least two active sensing cells comprise at least four active sensing cells bisected by the third plane and arranged symmetric relative to the second plane.

9. The condition monitoring device according to claim 1, wherein the at least two active sensing cells comprise a first active sensing cell, a second active sensing cell, a third active sensing cell and a fourth active sensing cell,
   wherein the first and second active sensing cells are located above the second plane,
   wherein the third and fourth active sensing cells are located below the second plane,
   wherein the first and third active sensing cells are located to a first side of the third plane, and
   wherein the second and fourth active sensing cells are located to a second side of the third plane.

10. The condition monitoring device according to claim 9, wherein the first and second active sensing cells are located equidistant from the third plane and the first and third active sensing cells are located equidistant from the second plane.

11. The condition monitoring device according to claim 1, wherein the printed circuit board assembly includes an antenna for wireless communication.

12. The condition monitoring device according to claim 1, wherein the first and second active sensing cells are piezoelectric elements or accelerometers.

13. The condition monitoring device according to claim 1, wherein the first and second active sensing cells are vibration sensors.

14. The condition monitoring device according to claim 1, wherein the second plane does not intersect a top edge of the at least one printed circuit board and does not intersect a bottom edge of the at least one printed circuit board.

15. A method for processing vibration signal received from the condition monitoring device according to claim 1, comprising:
   associating the vibration signals (S1, S2, S3) in the time domain provided respectively from the active sensing cells in order to obtain a resulting signal (S) in the frequency domain having an amplitude (S1+S2+S3) without noise;
   amplifying the resulting signal (S); and
   transmitting said amplified resulting signal to a data processor.

* * * * *